United States Patent
Wang et al.

(10) Patent No.: US 6,970,530 B1
(45) Date of Patent: Nov. 29, 2005

(54) HIGH-RELIABILITY SHIFT REGISTER CIRCUIT

(75) Inventors: Wen-Chun Wang, Taichung (TW); Wen-Tui Liao, Taichung (TW); Ja-Fu Tsai, Chiayi (TW)

(73) Assignee: Wintek Corporation, Taichung (TW)

( * ) Notice: Subject to any disclaimer, the term of this patent is extended or adjusted under 35 U.S.C. 154(b) by 0 days.

(21) Appl. No.: 10/923,862

(22) Filed: Aug. 24, 2004

(51) Int. Cl.[7] .............................................. G11C 19/00
(52) U.S. Cl. ........................... 377/69; 345/99; 345/100
(58) Field of Search .......................... 377/69; 345/99, 345/100

(56) References Cited

U.S. PATENT DOCUMENTS

| | | | |
|---|---|---|---|
| 3,937,984 A | 2/1976 | Fry | |
| 4,598,214 A | * 7/1986 | Sexton | 327/213 |
| 5,222,082 A | 6/1993 | Plus | |
| 5,227,674 A | * 7/1993 | Takahashi et al. | 327/208 |

* cited by examiner

Primary Examiner—Margaret R. Wambach
(74) Attorney, Agent, or Firm—Birch, Stewart, Kolasch & Birch, LLP

(57) ABSTRACT

The main circuit of each stage of the high-reliability shift register circuit is composed of transistors, and the turn-on time for the four transistors are only 1~2 pulse time within one frame time. Transistors construct an inverter circuit which continuously offers a high-level supply voltage that controls activities of transistors so as to continuously offer a low-level supply voltage to the first node and the output terminal such that avoids the first node and the output terminal being in a floating state. Besides, one of the transistor acts as a charging circuit that extends the lifetime of another transistor. This circuit avoids the affection on the behavior of the shift register circuit that is caused by an a-Si (amorphous silicon) TFT under a sustained stress.

16 Claims, 17 Drawing Sheets

HIGH-RELIABILITY SHIFT REGISTER CIRCUIT

FIELD OF THE INVENTION

The present invention relates to a high-reliability shift register circuit and more particularly to a manufacturing process technology for the a-Si TFT, which avoids the malfunctioning situation for the shift register circuit resulting from the a-Si TFT under applied stress.

BACKGROUND OF THE INVENTION

The SOG (system on glass) technology can be actualized by technologies of a-Si and LTPS (low temperature poly-silicon). The major difference between a LTPS TFT and an a-Si TFT is the complexity of manufacturing process and the electrical characteristics. A LTPS TFT has a higher carrier-mobility whereas its manufacturing process is more complicated. By contrast, a-Si TFT has a lower carrier-mobility than LTPS, but its manufacturing process is simpler and well developed, and therefore an a-Si TFT has a better competitiveness in terms of cost.

Accordingly, due to the limit of manufacturing ability, the threshold voltage (Vth) for the manufactured a-Si TFT elements that follows the affection of the applied stress increases gradually. This is the important reason why a SOG cannot be actualized by an a-Si TFT. Therefore, overcoming the meta-stability of the Vth resulting from the manufacturing process so as to actualize the SOG by an a-Si TFT manufacturing process is the problem that to be solved urgently now.

Please refer to FIGS. 1 and 2 that are a schematic diagram and the timing diagram for the shift register circuit disclosed in Prior Art U.S. Pat. No. 5,222,082 entitled "Shift Register Useful as a Select Line Scanner for Liquid Crystal Display". As shown in FIG. 1, the circuit is composed of six TFTs, where TFT T5 is used to offer a high-level logic voltage to the output terminal Vout while TFT T6 is used to offer a low-level logic voltage to the output terminal Vout. The activities are described as follows. TFT T1 and T4 are turned on when the output voltage of the next-former stage g(i−1) is at a logic high voltage level. At this moment, the voltage level of node P1 is pulled up to high-level supply voltage Vdd because of the active TFT T1. TFT T5 is turned on when the voltage level of node P1 is higher than the Vth of TFT T5. The clock-pulse signal C1 is at a logic low voltage level at this time such that the output voltage Vout is pulled down to logic low voltage level via the discharging circuit formed by TFT T5. At the same time when TFT T4 is active, TFT T3 is also turned on because the output voltage of the next-former stage g(i−1) and the clock-pulse signal C3 are in-phase. For the purpose of smoothly discharging from the clock-pulse signal C1 to the output terminal Vout, the element dimension of T4 should be 10 times larger than T3's in order to lower the voltage level of node P2 so that circuit mis-action caused by active TFT T2 and TFT T6 can be avoided.

When the clock-pulse signal C1 rises from logic low voltage level to logic high voltage level, the voltage level of node P1 will rise from supply voltage Vdd to a higher level that is affected by the parasitic capacitance Cgs of TFT T5. This is so called bootstrap effect. This effect lets the clock-pulse signal C1 output more easily.

When the clock-pulse signal C1 goes back to logic low voltage level again from logic high voltage level, the voltage level of node P1 is still high. Until the clock-pulse signal C3 returns to logic high voltage level again, the voltage level of node P1 returns to logic low voltage level from logic high. As a result, the output voltage Vout is pulled down to logic low voltage level due to TFT T5 is turned on.

When the clock-pulse signal C3 returns to logic high voltage level again, the output voltage of the next-former stage g(i−1) is at a logic low level at this moment. Accordingly, TFT T4 is turned off and the voltage level of node P2 is pulled up to a high level as supply voltage Vdd due to TFT T3 is turned on. Due to the high-level voltage Vdd of node P2 turns on TFT T2 and TFT T6, both the voltage levels of node P1 and the output Vout will be pulled down to low-level supply voltage Vss. Until the next frame arrives, the output voltage of the next-former stage g(i−1) is pulled up to logic high voltage level again, the voltage levels of node P1 and the output Vout will be respectively pulled up to supply voltage Vdd and logic high voltage level again due to TFT T1 and T5 are turned on.

The defect of Prior Art U.S. Pat. No. 5,222,082 is that the whole shift register circuit needs three clock-pulse signals to complete the function. Moreover, nodes P1 and P2 of the circuit will be in a floating state for a short time, which results in circuit mis-actions due to nodes P1 and P2 are affected by clock-pulse signal or other noises. Besides, threshold voltages (Vth) for TFT T2, T3, and T6 increase because of the sustained stress, which leads to the circuit fails at last.

Further, please refer to FIGS. 3 and 4 that are the schematic diagram and the timing diagram for the shift register circuit disclosed in U.S. Pat. No. 3,937,984 entitled "Shift Register". The circuit is composed of three TFTs and one capacitor C, where TFT T2 is used to offer a high-level logic voltage to the output terminal Vout while TFT T3 is used to offer a low-level logic voltage to the output terminal Vout. TFT T1 is turned on when both the clock-pulse signal C1 and the output voltage of the next-former stage g(i−1) are at a logic high voltage level. At this moment, the voltage level of node P1 is pulled up to logic high voltage level via the charging circuit formed by TFT T1. TFT T2 is turned on when the voltage level of node P1 is higher than the Vth of TFT T2. The clock-pulse signal C2 is at a logic low voltage level at this time such that the output voltage Vout is pulled down to logic low voltage level via the discharging circuit formed by TFT T2.

When the clock-pulse signal C2 rises from logic low voltage level to logic high voltage level, the voltage level of node P1 will rise to a higher level that is affected by the parasitic capacitance Cgs of TFT T2, which is the bootstrap effect. This effect lets the clock-pulse signal C2, which is at a logic high voltage level now, output more easily. When the clock-pulse signal C2 goes back to logic low voltage level again from logic high voltage level, the clock-pulse signal C1 is at a logic high voltage level at this time such that the voltage level of node P1 is pulled down to logic low voltage level via the discharging circuit formed by TFT T1 and TFT T2 is turned off. At this moment, the control voltage Vc1 continuously supplies a logic high voltage to the gate of TFT T3, which keeps the output voltage Vout at low-level supply voltage Vss. Until the next frame arrives, the output voltage of the next-former stage g(i−1) is pulled up to logic high voltage level again, the voltage levels of node P1 and the output Vout will be pulled up to logic high voltage level again due to TFT T1 and T2 are turned on.

However, in the shift register circuit of the U.S. Pat. No. 3,937,984, node P1 will be in a floating state for a short time, which results in the circuit mis-action of TFT turn-on due to nodes P1 is affected by clock-pulse signal or other noises.

Besides, threshold voltages (Vth) for TFT T1 and T3 increase because of the sustained stress, which leads to the circuit fails at last.

SUMMARY OF THE INVENTION

Therefore, the main purpose of the current invention is to avoid the malfunctioning situation for the shift register circuit resulting from the a-Si TFT under applied stress.

Another purpose of the current invention is to supply a continuous discharging path by using a-Si TFT M8 and M9 so as to avoid node P1 and Vout(i) being shortly floated.

The shift register of this invention is composed of several stages (Stage 1~Stage n). The stages are connected in serial and send the output signals Vout(1)~Vout(n) to the load, for example, the panel. Initially, a serial-in signal SIN is fed into the Stage 1, and input signals for the rest stages are from the output signal of the next-former stage individually. The shift register is controlled by two clock-pulse signals, C1 and C2, which are out of phase. Each stage consists of nine transistors. The main circuit of each stage of the shift register circuit is composed of transistors M1~M4, and the turn-on time for the four transistors are only 1~2 pulse time within one frame time. Transistors M5 and M7 construct an inverter circuit which continuously offers a high-level supply voltage Vdd that controls activities of transistors M8 and M9 so as to continuously offer a low-level supply voltage Vss to the first node P1 and the output terminal Vout(i) such that the first node P1 and the output terminal Vout(i) being in a floating state is avoided.

By way of this, even threshold voltages (Vth) for transistors M8 and M9 keep increasing because of the sustained stress, the steady-state saturation current supplements moderately so as to avoid mis-actions of node P1 and output terminal Vout(i) affected by clock-pulse signal or other noises.

The foregoing, as well as additional objects, features and advantages of the invention will be more readily apparent from the following detailed description, which proceeds with reference to the accompanying drawings.

DESCRIPTION OF THE PREFERRED EMBODIMENT

Figure 1:
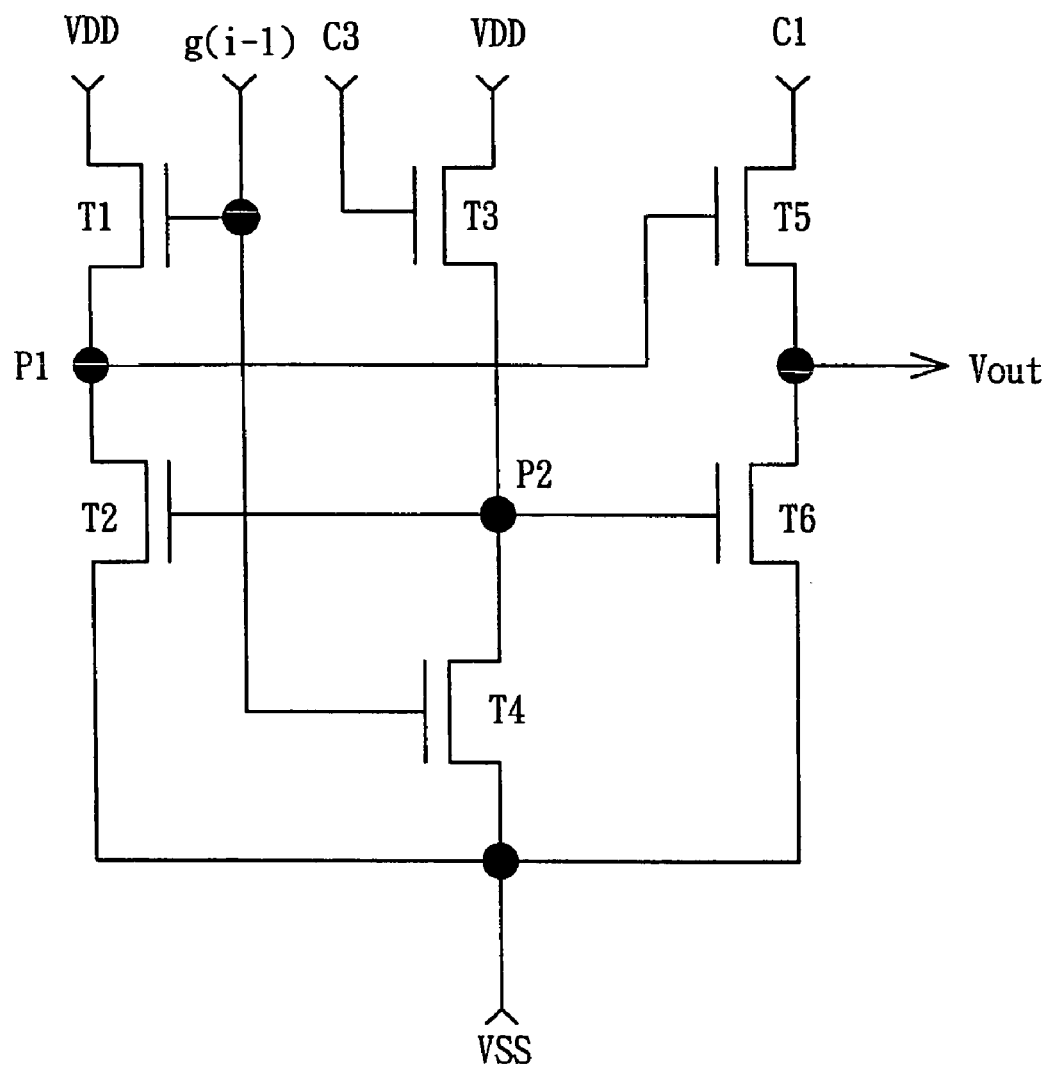
FIG. 1 is a schematic circuit for the U.S. Pat. No. 5,222,082.
Figure 2:
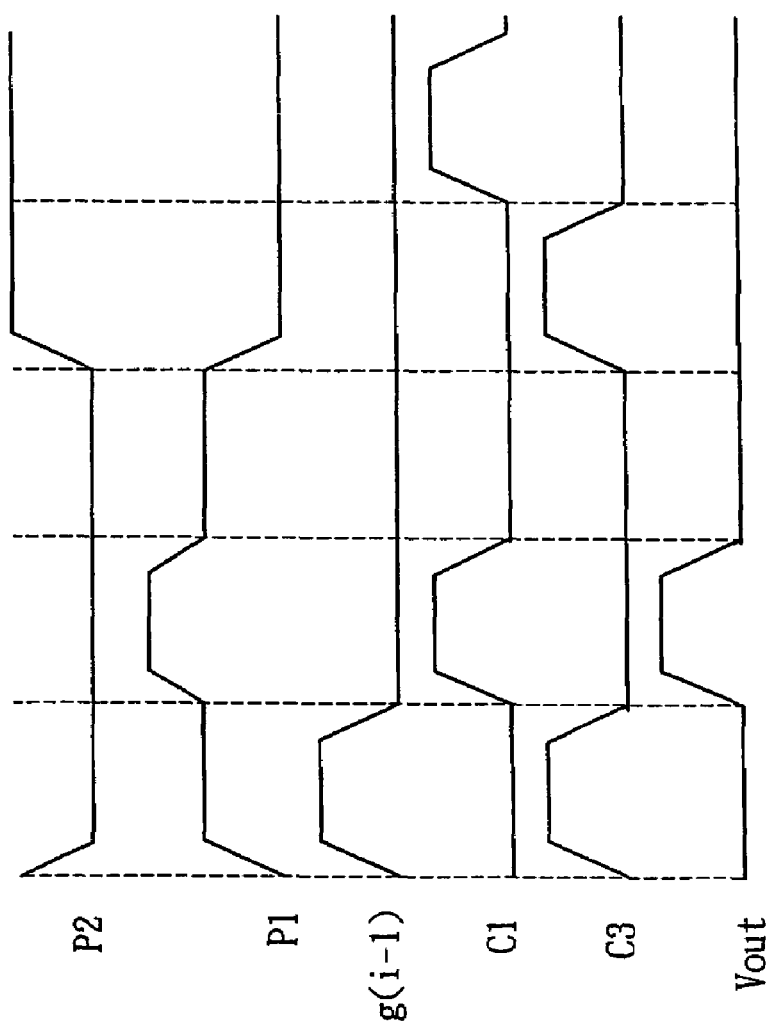
FIG. 2 is a timing diagram for FIG. 1.
Figure 3:
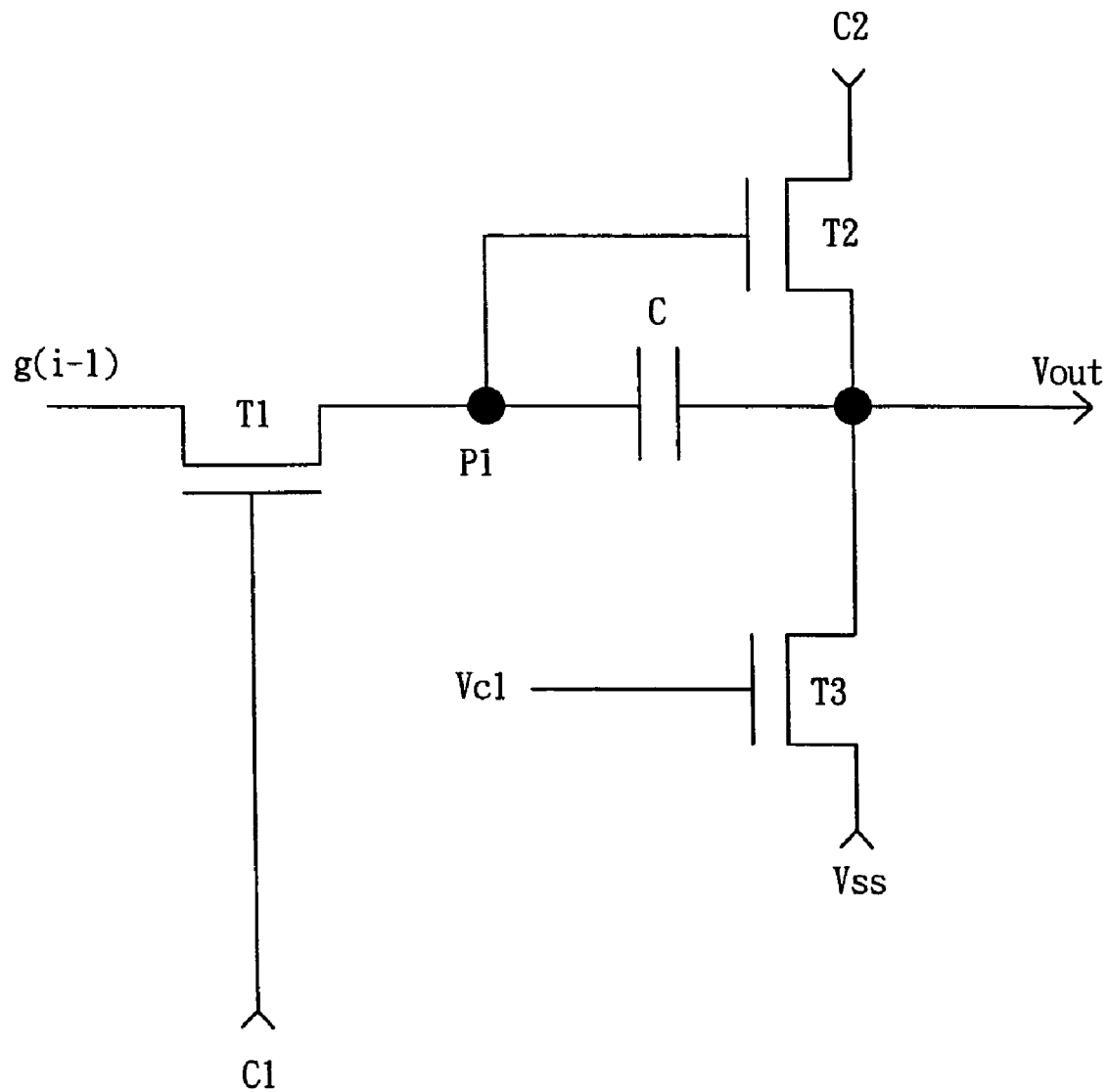
FIG. 3 is a schematic circuit for the U.S. Pat. No. 3,937,984.
Figure 4:
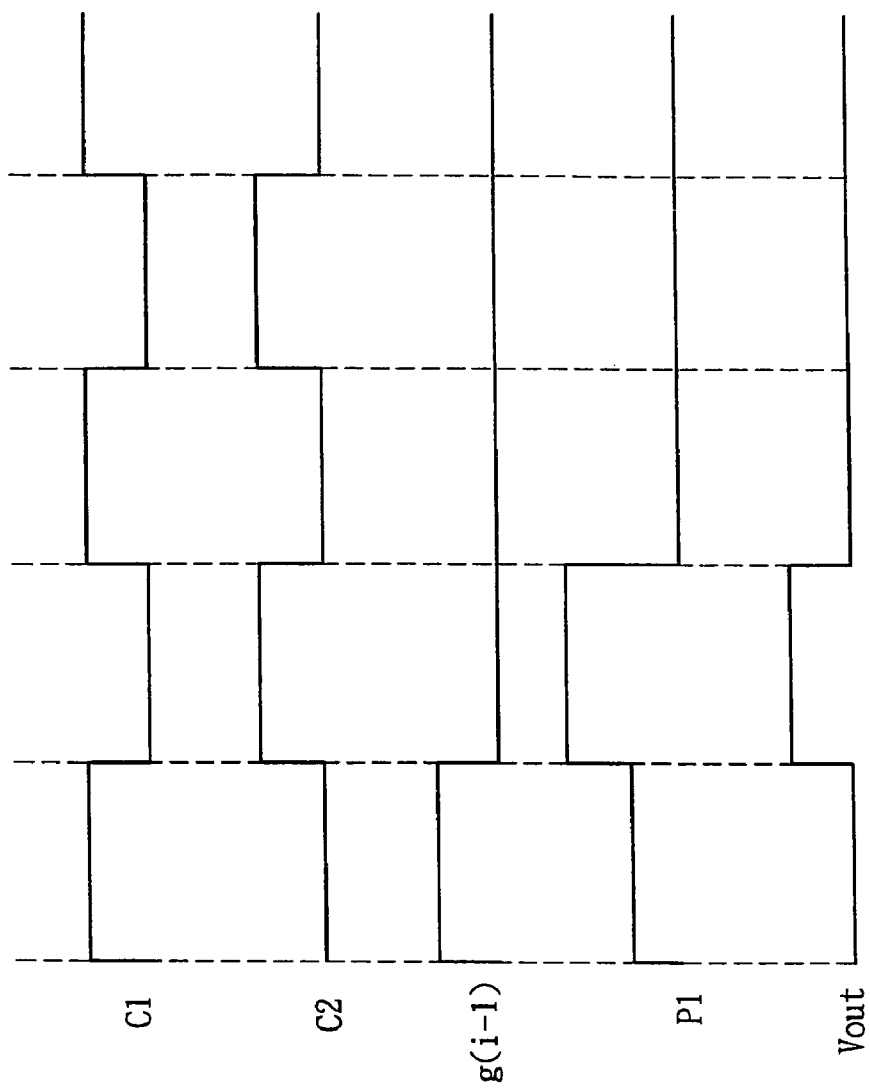
FIG. 4 is a timing diagram for FIG. 3.
Figure 5:
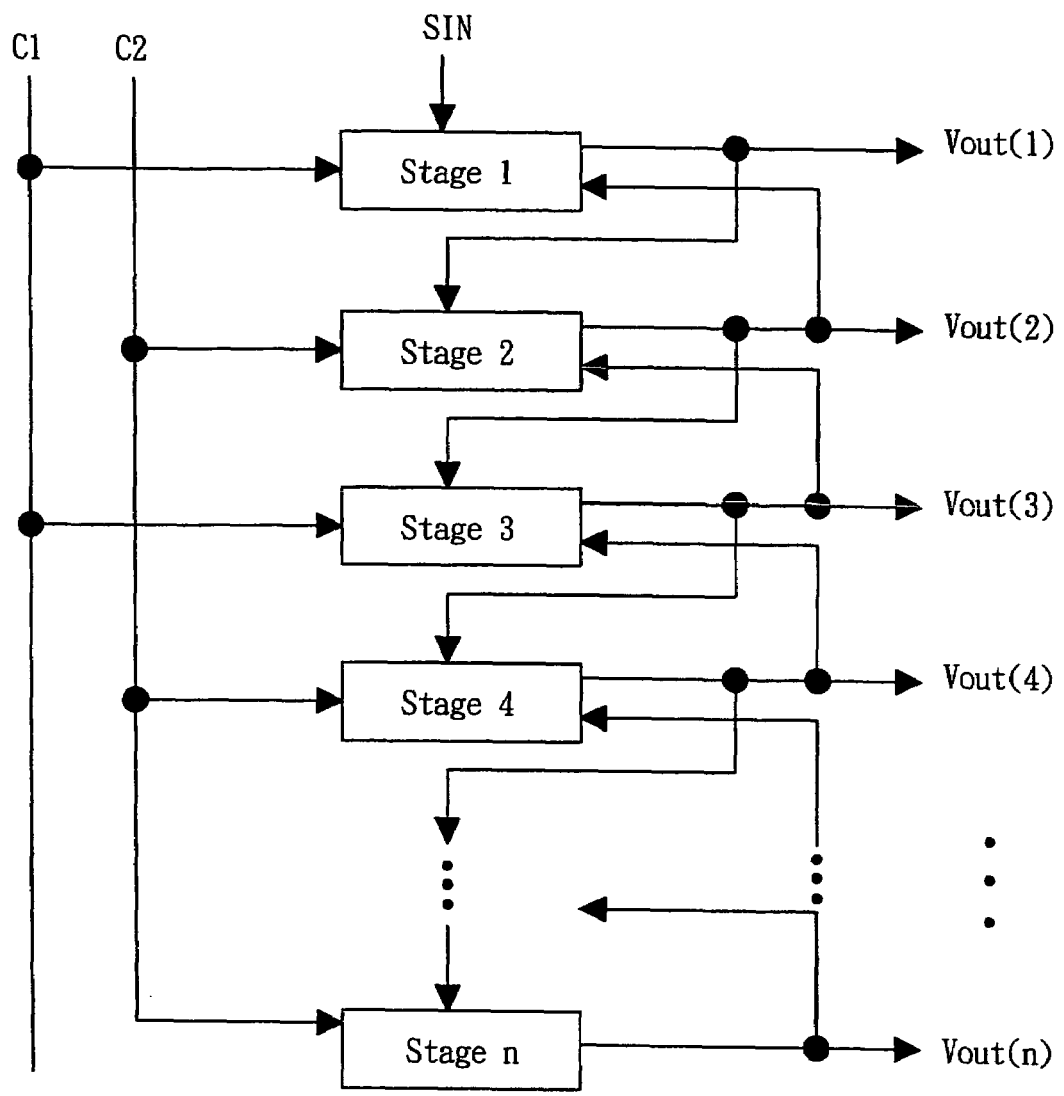
FIG. 5 is a block diagram of the shift register of the current invention.
Figure 6:
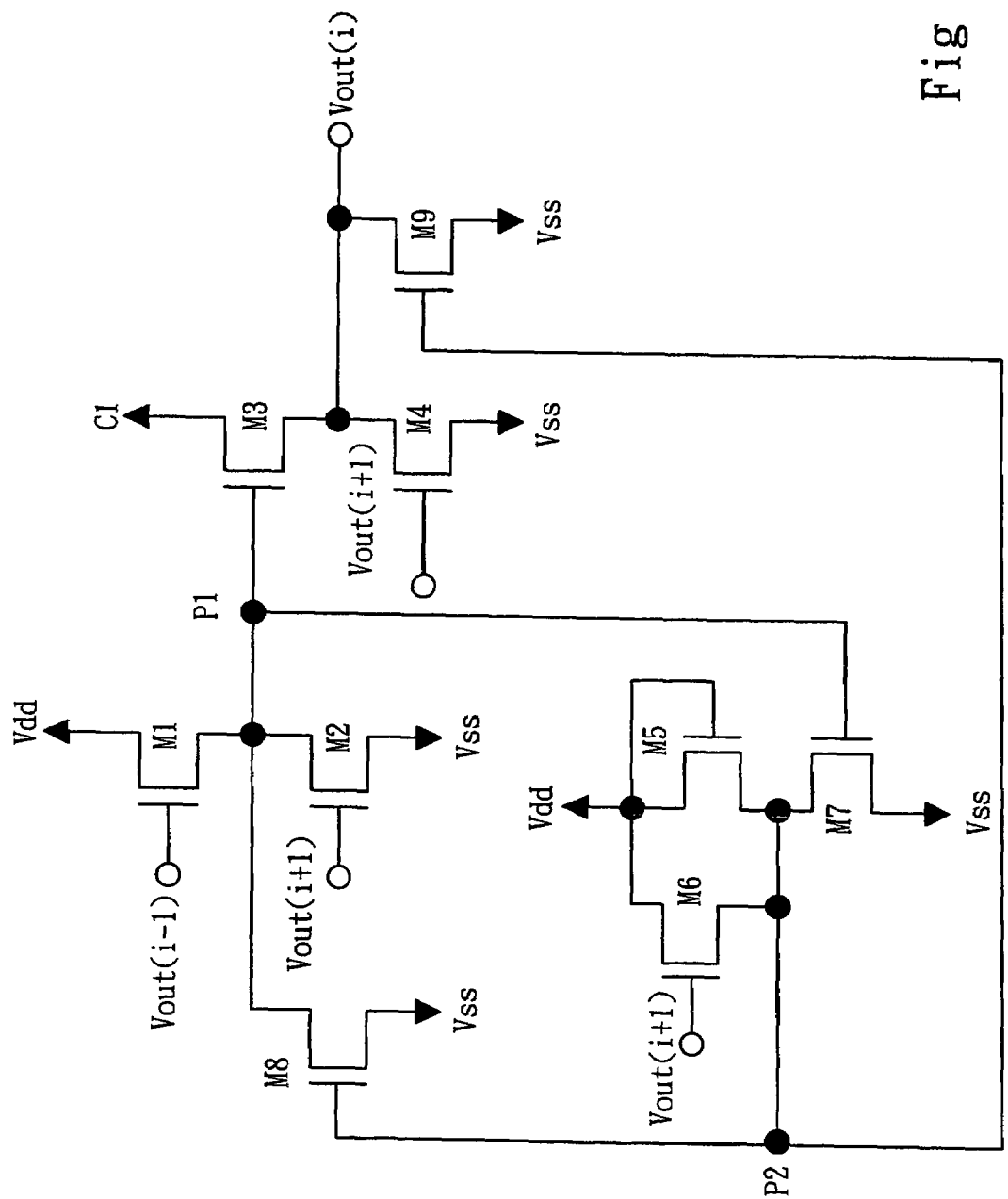
FIG. 6 is a schematic circuit for the 1st embodiment of the current invention.

Please refer to FIGS. 5 and 6, which are the block diagram of the shift register and the schematic circuit for the 1st embodiment of the current invention. As shown in figures, the shift register is composed of several stages (Stage 1~Stage n). The stages are connected in serial and send the output signals Vout(1)~Vout(n) to gate lines of the panel. Initially, a serial-in signal SIN is fed into the first stage (Stage 1), and input signals for the rest stages are from the output signal of the next-former stage Vout(1)~ Vout(i−1) respectively. The shift register circuit is controlled by two clock-pulse signals, C1 and C2, which are out of phase, where C1 controls odd stages and even stages are controlled by C2.

The inner circuit of odd stages includes the first one transistor M1 whose gate connects to the output signal of the next-former stage Vout(i−1) and the drain connects to the high-level supply voltage Vdd; the second one transistor M2 whose gate connects to the output signal of the next-latter stage Vout(i+1), the source connects to the low-level supply voltage Vss, and the drain and the source of transistor M1 form the first node P1; the third one transistor M3 whose gate connects to the first node P1 and the drain connects to the first clock-pulse signal C1; the fourth one transistor M4 whose gate connects to the output signal of the next-latter stage Vout(i+1), the source connects to the low-level supply voltage Vss, and the drain and the source of transistor M3 form the output terminal of this stage.

The fifth one transistor M5 whose gate and drain connect to the high-level supply voltage Vdd; the sixth one transistor M6 whose gate connects to the output signal of the next-latter stage Vout(i+1), the drain connects to the high-level supply voltage Vdd, and the source and the source of transistor M5 form the second node P2; the seventh one transistor M7 whose gate connects to the first node P1, the source connects to the low-level supply voltage Vss, and the drain connects to the source of transistor M5. The fifth one transistor M5 and the seventh one transistor M7 form an inverter. Because the resistance of the seventh one transistor M7 should be less than the resistance of the fifth one transistor M5, so the dimension of the seventh one transistor M7 should be larger than the dimension of the fifth one transistor M5. The eighth one transistor M8 whose gate connects to the second node P2, the source connects to the low-level supply voltage Vss, and the drain connects to the first node P1; the ninth one transistor M9 whose gate connects to the second node P2, the source connects to the low-level supply voltage Vss, and the drain connects to the output terminal of this stage Vout(i).

However, when the foregoing circuit is the inner circuit of even stages, the drain of the third one transistor M3 should connect to the second clock-pulse signal C2.

Among which, the foregoing transistors are amorphous silicon Thin Film Transistors (a-Si TFT) or Low Temperature Poly-Silicon Thin Film Transistors (LTPS TFT) that have a higher carrier-mobility.

The action principles for the circuit are described as follows.

1. The third transistor M3 of the current invention is used to offer a high-level logic voltage to the output terminal Vout(i) while the fourth transistor M4 is used to offer a low-level logic voltage to the output terminal Vout(i). The first transistor M1 is turned on when the output voltage of the next-former stage Vout(i-1) is at a logic high voltage level. At this moment, the high-level supply voltage will charge node P1 through the first transistor M1. The third transistor M3 is turned on when the voltage level of node P1 is higher than the Vth (threshold voltage) of the third transistor M3. The clock-pulse signal C1 is at a logic low voltage level at this time such that the output voltage Vout(i) is pulled down to logic low voltage level via the discharging circuit formed by the third transistor M3.

2. When the clock-pulse signal C1 rises from logic low voltage level to logic high voltage level, the voltage level of node P1 will rise from supply voltage Vdd to a higher level that is affected by the parasitic capacitance Cgs of the third transistor M3. This is so called bootstrap effect. This effect lets the clock-pulse signal C1 (which is at a high-level voltage now) output more easily.

Figure 7:
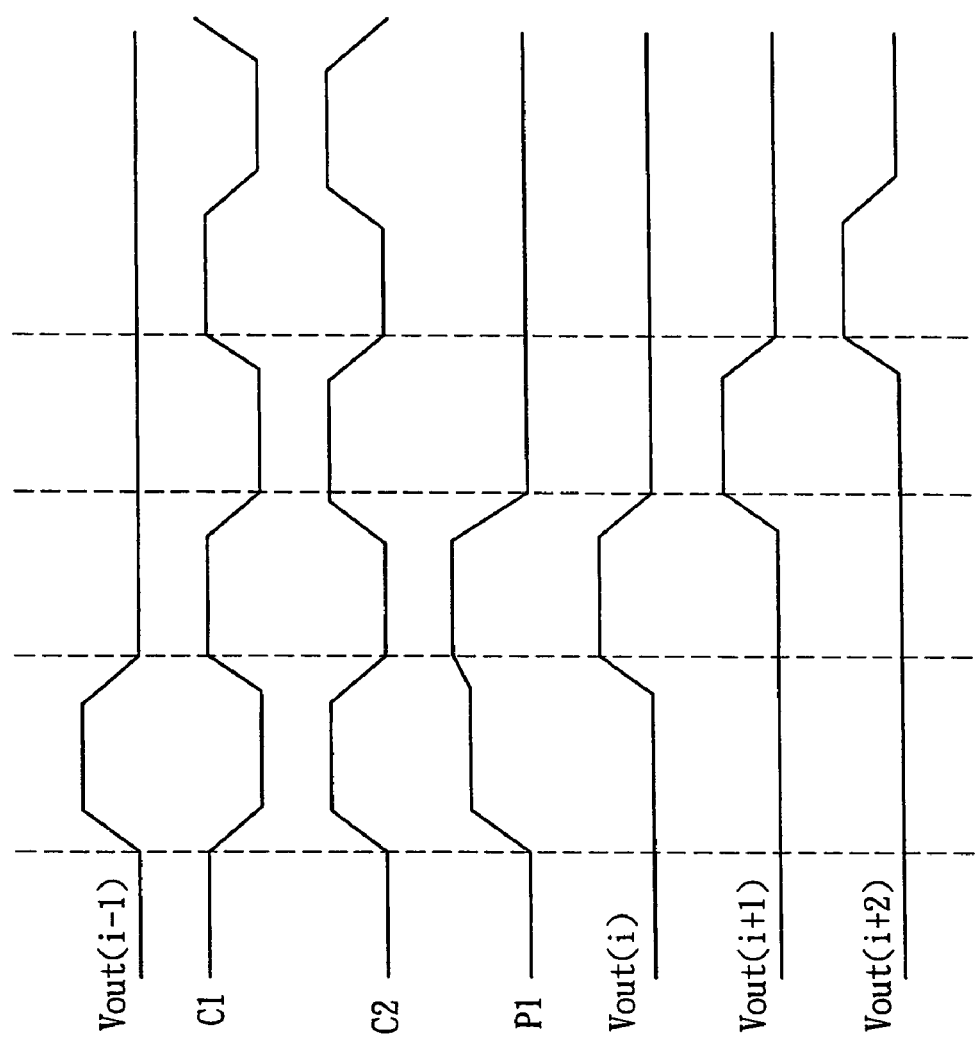
FIG. 7 is a timing diagram for the shift register of the current invention.

3. When the first clock-pulse signal C1 goes back to logic low voltage level again from logic high voltage level, the second transistor M2 and the fourth transistor M4 will be turned on under the control of the output signal of the next-latter stage Vout(i+1) (which is at a logic high voltage level). Therefore, the voltage level of node P1 and the output voltage Vout(i) are pulled down to logic low voltage level via the discharging circuit formed by the second transistor M2 and the fourth transistor M4. Until the next frame arrives, the voltage levels of node P1 and the output Vout(i) will be pulled up to Vdd and logic high voltage level again due to the first transistor M1 and the third transistor M3 are turned on. The timing diagram for the above-mentioned actions is shown in FIG. 7.

The main circuit is composed of transistors M1~M4, and the turn-on time for the four transistors are only 1~2 pulse time within one frame time. Hence the transistors will almost not be affected by the applied stress that results in the meta-stability of the threshold voltage Vth.

4. Because the voltage levels of node P1 and the output Vout(i) drop from logic high voltage level to logic low voltage level by discharging is caused by turning on the second transistor M2 and the fourth transistor M4 that is controlled by the logic high voltage level of the next-latter stage Vout(i+1). However, the Vout(i+1) is at a logic high voltage level for only one pulse time within one frame time. The first node P1 and output Vout(i) are in a floating state for most time, which results in the circuit mis-action due to nodes P1 and output Vout(i) are easily affected by clock-pulse signal or other noises.

Consequently, the current invention uses the fifth transistor M5 and the first node P1 controlled the seventh transistor M7 to construct an inverter circuit which continuously offers a high-level supply voltage Vdd that controls activities of transistors M8 and M9 so as to continuously offer a low-level supply voltage Vss to the first node P1 and the output terminal Vout(i) such that the first node P1 and the output terminal Vout(i) being in a floating state is avoided. The sixth one transistor M6 is added to act as a charging circuit which extends the lifetime of transistor M5. This circuit avoids that M5 cannot continuously offer a high-level supply voltage Vdd to the eighth transistor M8 and the ninth transistor M9 after M5 is stressed such that brings about the first node P1 and the output terminal Vout(i) being in a floating state. Because the control signal of the sixth transistor M6 is controlled by the output signal of the next-latter stage Vout(i+1), so the sixth transistor M6 has not to consider the problem of applied tress.

5. Moreover, the eighth transistor M8 and the ninth transistor M9 serve a supplement function that avoids the first node P1 and the output terminal Vout(i) being in a floating state. By way of this, even threshold voltages (Vth) for transistors M8 and M9 keep increasing because of the sustained stress, the steady-state saturation current supplements moderately so as to avoid mis-actions of node P1 and output terminal Vout(i) affected by clock-pulse signal or other noises.

According to the aforementioned description, except the particular function of the eighth transistor M8 and the ninth transistor M9 in the current invention, the rest of the a-Si TFTs are not affected by the factor of applied stress. Consequently, the current invention overcomes the meta-stability of the Vth resulting from the manufacturing process so as to actualize the SOG by an a-Si TFT manufacturing process.

Figure 8:
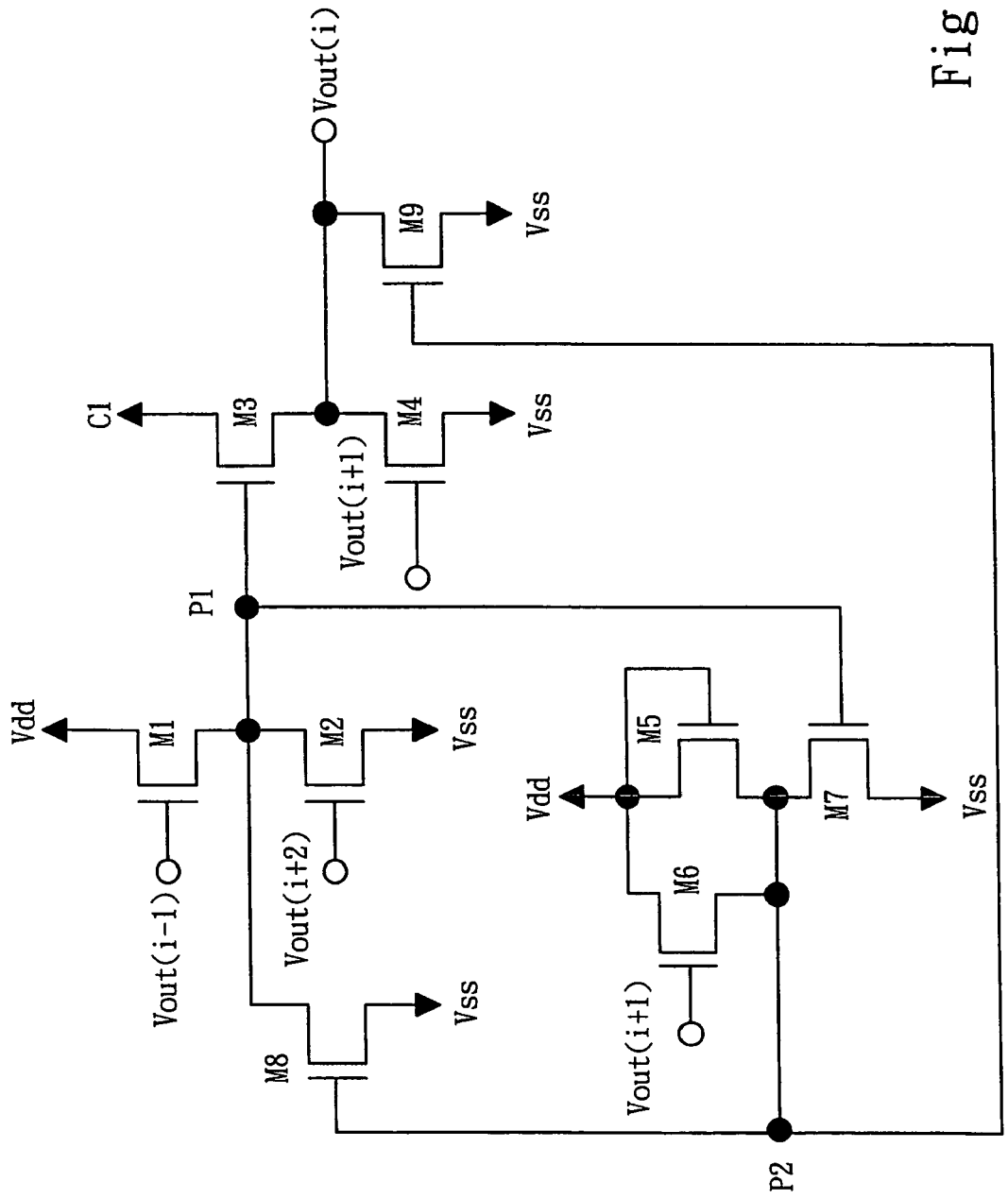
FIG. 8 is a schematic circuit for the 2nd embodiment of the current invention.

Please refer to FIG. 8, which is the schematic circuit for the 2nd embodiment of the current invention. As shown in the figure, the difference between this example and the 1st embodiment is the second transistor M2 whose control signal for the gate is supplied by the output signal of the next-next-latter stage Vout(i+2).

The second transistor M2 which is controlled by the output signal of the next-next-latter stage Vout(i+2) serves a supplement function such that the first node P1 adds a discharging loop due to the active transistor M2. By way of this, the lifetime of the eighth transistor M8 is extended.

The timing diagram is shown in FIG. 7. When the first clock-pulse signal C1 goes back to logic low voltage level again from logic high voltage level, the fourth transistor M4 and the sixth transistor M6 will be turned on under the control of the output signal of the next-latter stage Vout(i+1). Because the voltage level of the second node P2 is pulled up to Vdd, the eighth transistor M8 and the ninth transistor M9 are turned on at the same time. Therefore, the voltage level of node P1 is pulled down to the low-level supply voltage Vss via the discharging circuit formed by the eighth transistor M8. (Of course, similar to the description for the 1st embodiment, the eighth transistor M8 also has the supplement function.) The voltage level of the output terminal Vout(i) is pulled down to the low-level supply voltage Vss via the discharging circuit formed by the fourth transistor M4. Until the next frame arrives, the voltage levels of node P1 and the output Vout(i) will be respectively pulled up to Vdd and logic high voltage level again due to the first transistor M1 and the third transistor M3 are turned on.

Figure 9:
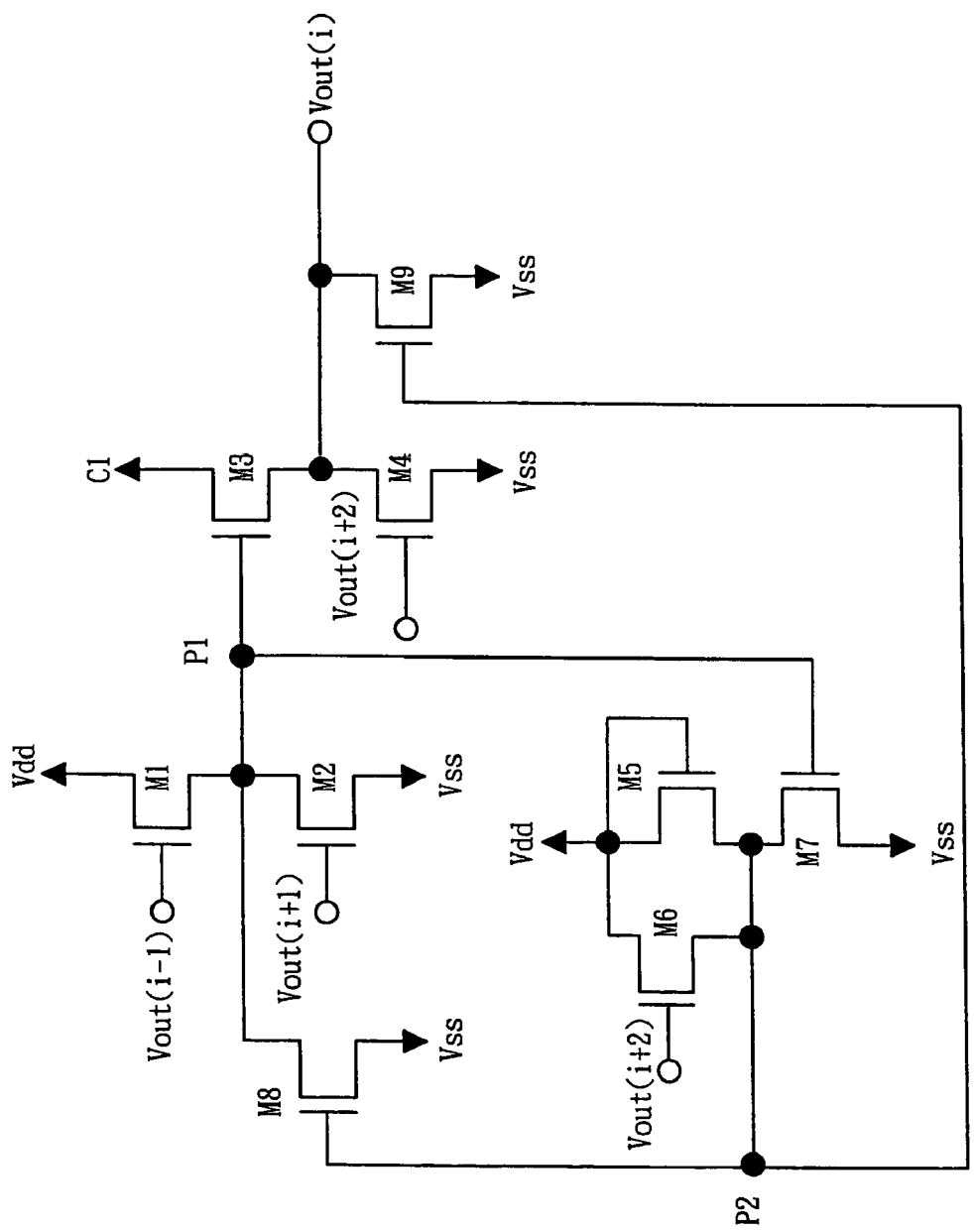
FIG. 9 is a schematic circuit for the 3rd embodiment of the current invention.

Please refer to FIG. 9, which is the schematic circuit for the 3rd embodiment of the current invention. As shown in the figure, the difference between this example and the 1st embodiment is the fourth transistor M4 and the sixth transistor M6 whose control signals for the gates are supplied by the output signal of the next-next-latter stage Vout(i+2).

The fourth transistor M4 and the sixth transistor M6 which are controlled by the output signal of the next-next-latter stage Vout(i+2) not only serve the supplement function but also reduce the affection extent due to the applied stress for the ninth transistor M9 and the fifth transistor M5 such that the circuit lifetime is extended.

The timing diagram is shown in FIG. 7. When the first clock-pulse signal C1 goes back to logic low voltage level again from logic high voltage level, the second transistor M2 will be turned on under the control of the output signal of the next-latter stage Vout(i+1) (which is at a logic high voltage level). Therefore, the voltage level of node P1 is pulled down to the low-level supply voltage Vss via the discharging circuit formed by the second transistor M2. Accordingly, the third transistor M3 is turned off and the output voltage level Vout(i) is pulled down to the low-level supply voltage Vss via the active transistor M9 (Of course, similar to the description for the 1st embodiment, the ninth transistor M9 also has the supplement function). Until the next frame arrives, the voltage levels of node P1 and the output Vout(i) will be respectively pulled up to Vdd and logic high voltage level again due to the first transistor M1 and the third transistor M3 are turned on.

Figure 10:
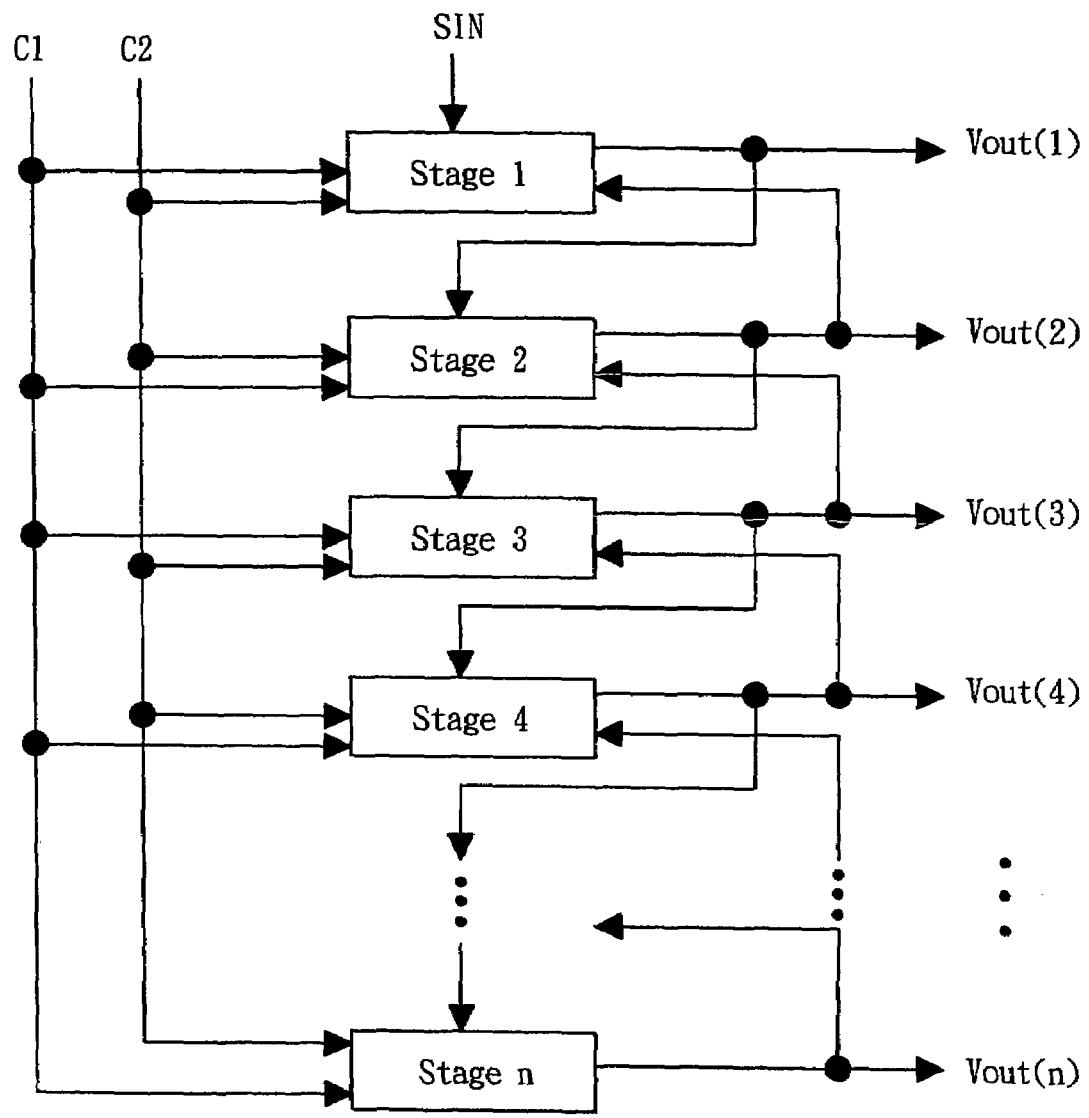
FIG. 10 is a block diagram of another shift register of the current invention.
Figure 11:
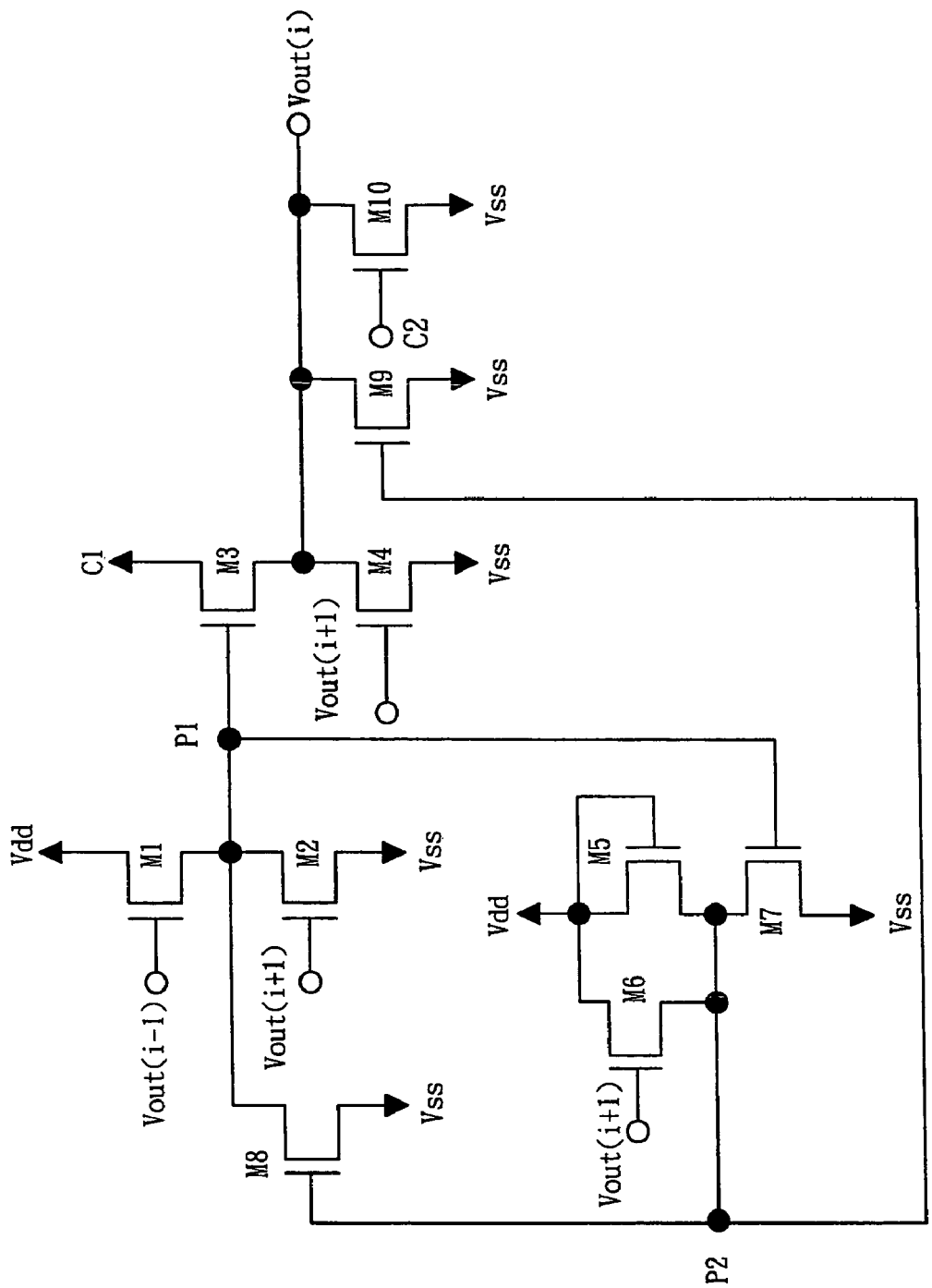
FIG. 11 is a schematic circuit for the 4th embodiment of the current invention.

Please refer to FIGS. 10 and 11, which are the block diagram of another shift register of the current invention and the schematic circuit for the 4th embodiment. As shown in figures, the difference between this example and the 1st embodiment is that the tenth one transistor M10 is added to the output terminal Vout(i) of odd stages of the shift register. The tenth transistor M10 whose gate connects to the second clock pulse signal C2, the source connects to the low-level supply voltage Vss, and the drain connects to the output terminal of this stage Vout(i).

However, the drain of the third transistor M3 of the even stages connects to the second clock pulse signal C2, and the gate of the tenth transistor M10 connects to the first clock pulse signal C1.

The timing diagram is shown in FIG. 7. The added tenth transistor M10 is used to assist the ninth transistor M9 in promoting the supplement ability. Because the tenth transistor M10 is controlled by the second clock pulse signal C2, which not only promotes the supplement ability but also extends the circuit lifetime. Therefore, the ninth transistor M9 and the tenth transistor M10 complement to each other in this circuit. The ninth transistor M9 turns on continuously will avoid the output terminal Vout(i) being shortly floated.

Figure 12:
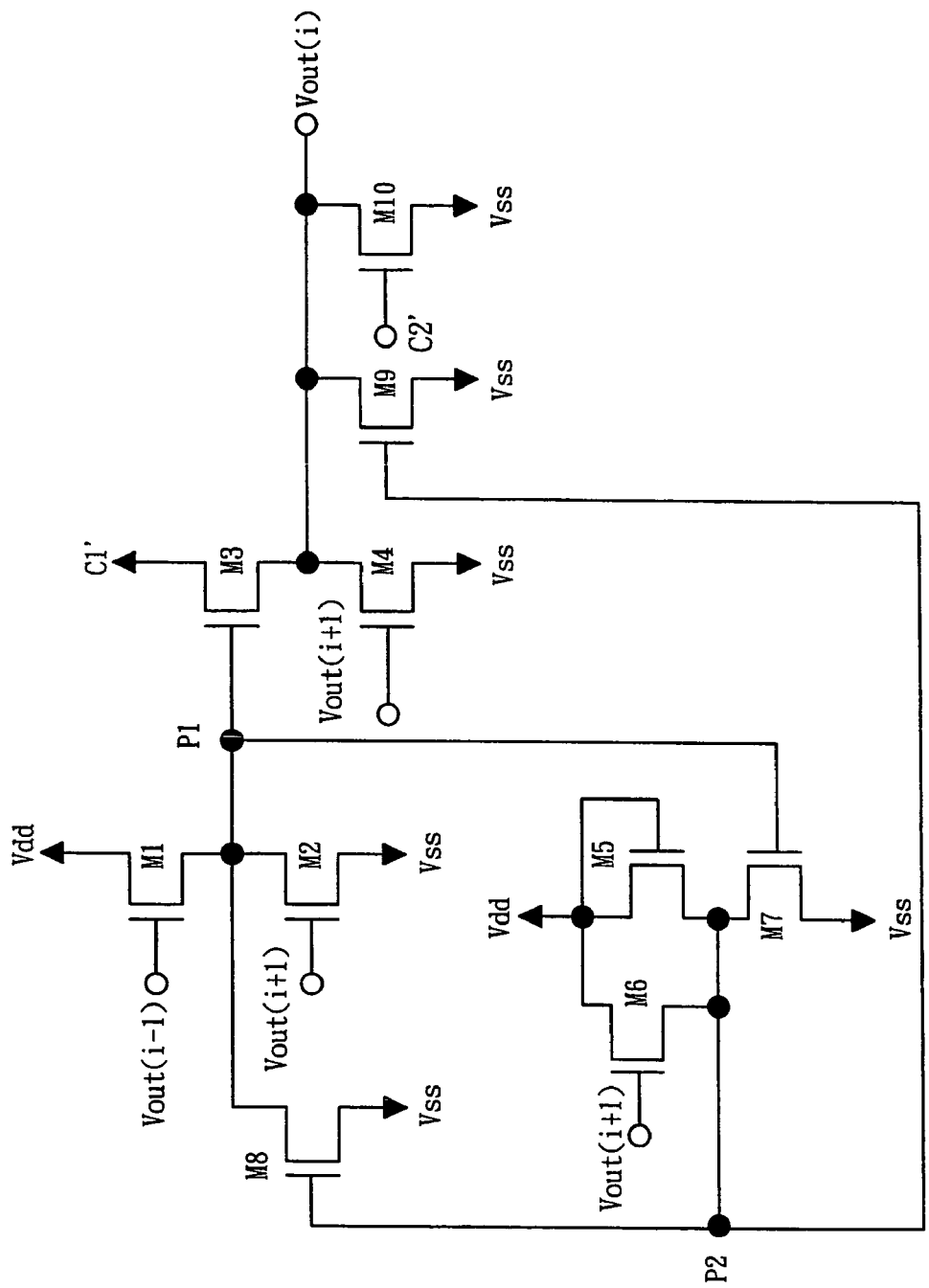
FIG. 12 is a schematic circuit for the 5th embodiment of the current invention.
Figure 13:
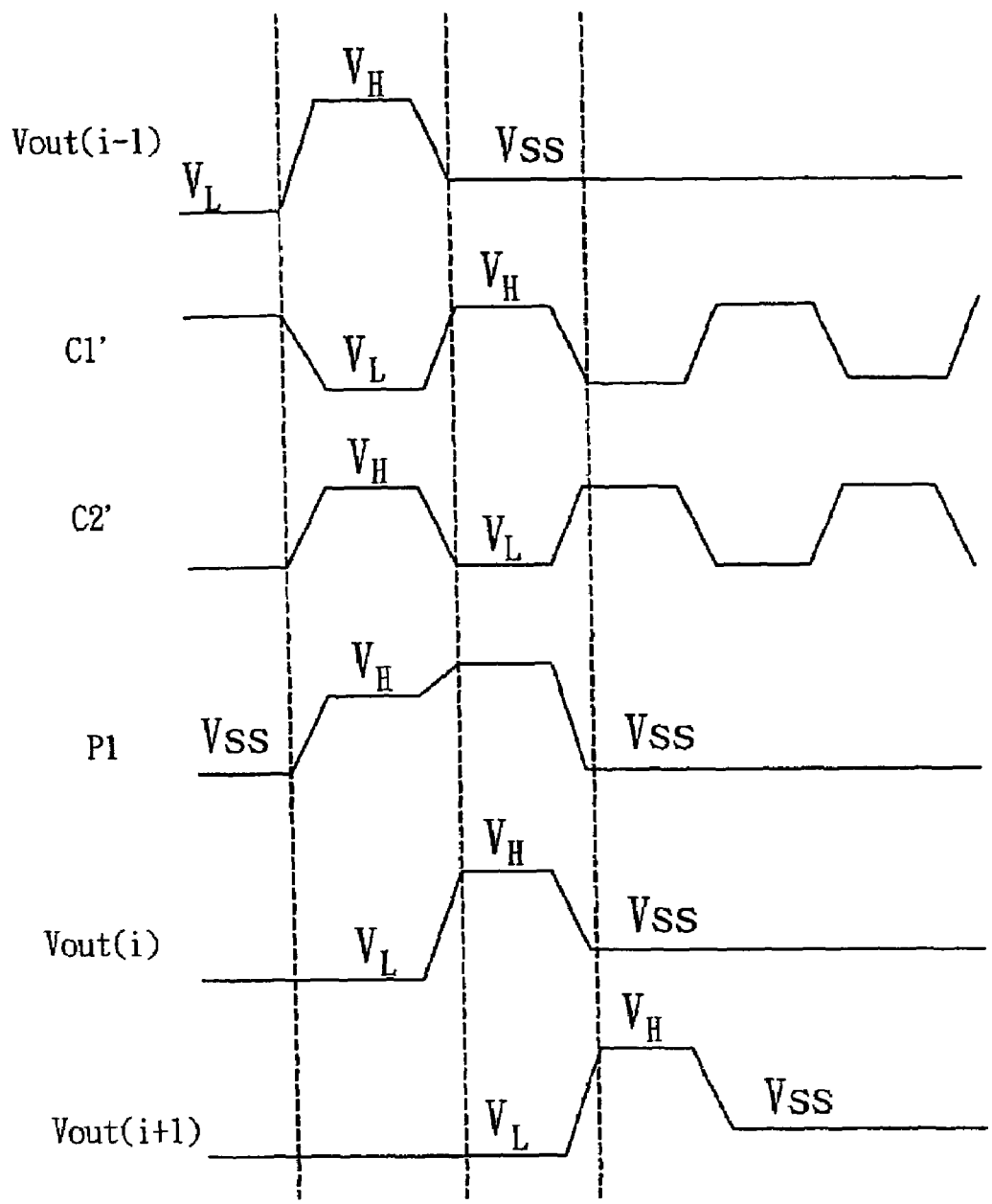
FIG. 13 is another timing diagram for the shift register of the current invention.

Please refer to FIG. 12, which is the schematic circuit for the 5th embodiment of the current invention. As shown in the figure, the difference between this example and the 4th embodiment is that clock pulse signals C1 and C2 in this circuit are replaced by clock pulse signals C1' and C2'. The timing diagram is shown in FIG. 13. The logic high voltage level $V_H$ for C1' and C2' equals the high-level supply voltage Vdd while the logic low voltage level $V_L$ for C1' and C2' is slightly lower than the low-level supply voltage Vss.

Because the threshold voltage Vth for an a-Si TFT has the characteristic of recovery, i.e. a positive stress increases the Vth of an a-Si TFT and a negative stress decreases the Vth of an a-Si TFT. Consequently, the logic low voltage level $V_L$ of the second clock pulse signal C2' is slightly lower than the low-level supply voltage Vss, which results in the tenth transistor M10 being at a negative stress when it is turned off so as to recover the Vth of the tenth transistor M10 and to extend the lifetime of the tenth transistor M10.

Figure 14:
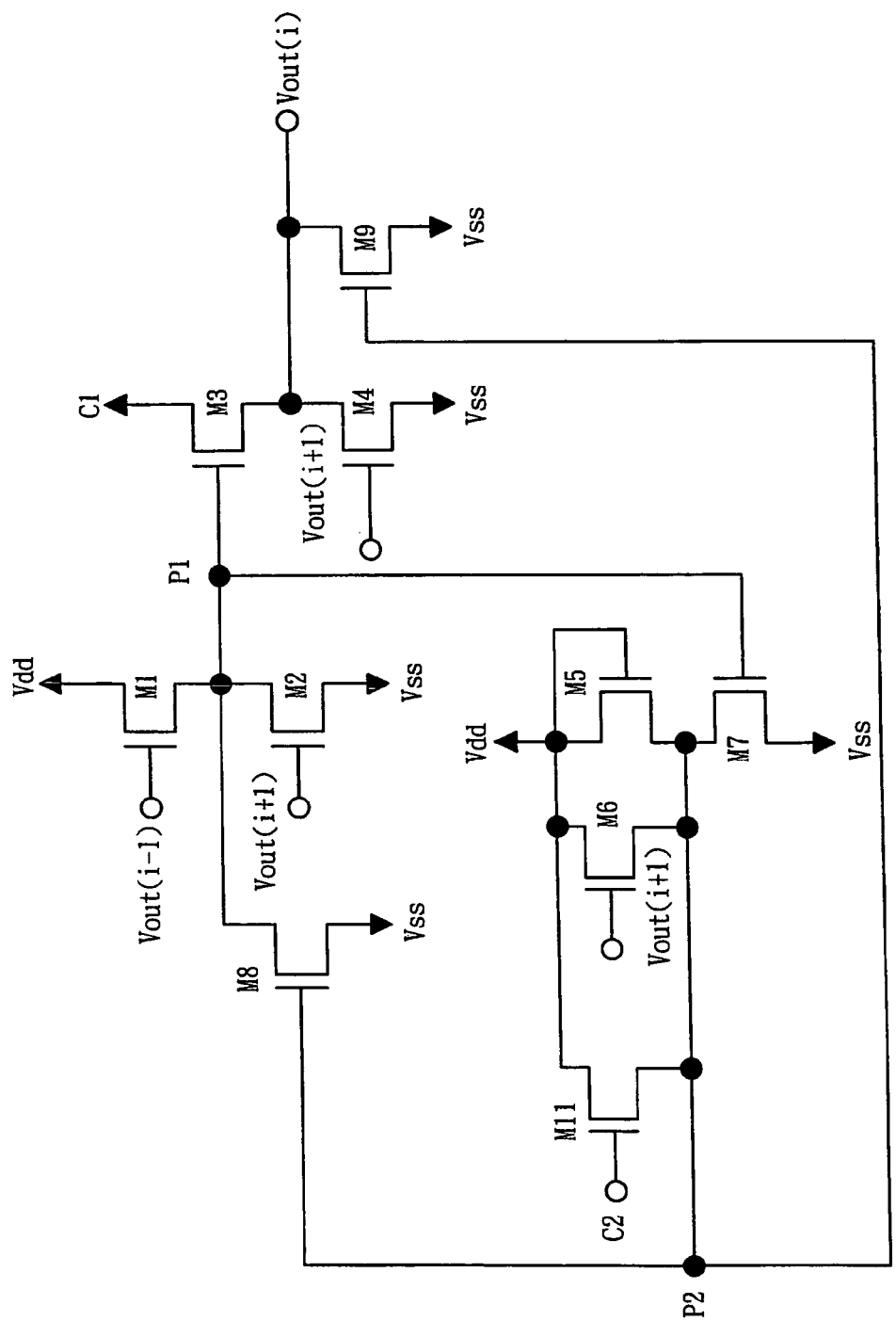
FIG. 14 is a schematic circuit for the 6th embodiment of the current invention.

Please refer to FIGS. 10 and 14, which are the block diagram of another shift register of the current invention and the schematic circuit for the 6th embodiment. As shown in figures, the difference between this example and the 1st embodiment is that the eleventh one transistor M11 is added to be parallel to the fifth transistor M5 and the sixth transistor M6. The gate of transistor M11 connects to the second clock-pulse signal C2, which offers a charging loop so as to avoid that the fifth transistor M5 cannot continuously supply the high-level supply voltage to the eighth transistor M8 and the ninth transistor M9 that results in the first node P1 and the output terminal Vout(i) being in a floating state. The timing diagram is shown in FIG. 7.

Transistors M5 and M11 complement to each other in this circuit. The fifth transistor M5 turns on continuously will avoid the first node P1 and the output terminal Vout(i) being shortly floated. The eleventh transistor M11 is controlled by the second clock pulse signal C2, which not only promotes the supplement ability but also extends the circuit lifetime.

However, the drain of the third transistor M3 of the even stages connects to the second clock pulse signal C2, and the gate of the eleventh transistor M11 connects to the first clock pulse signal C1.

Figure 15:
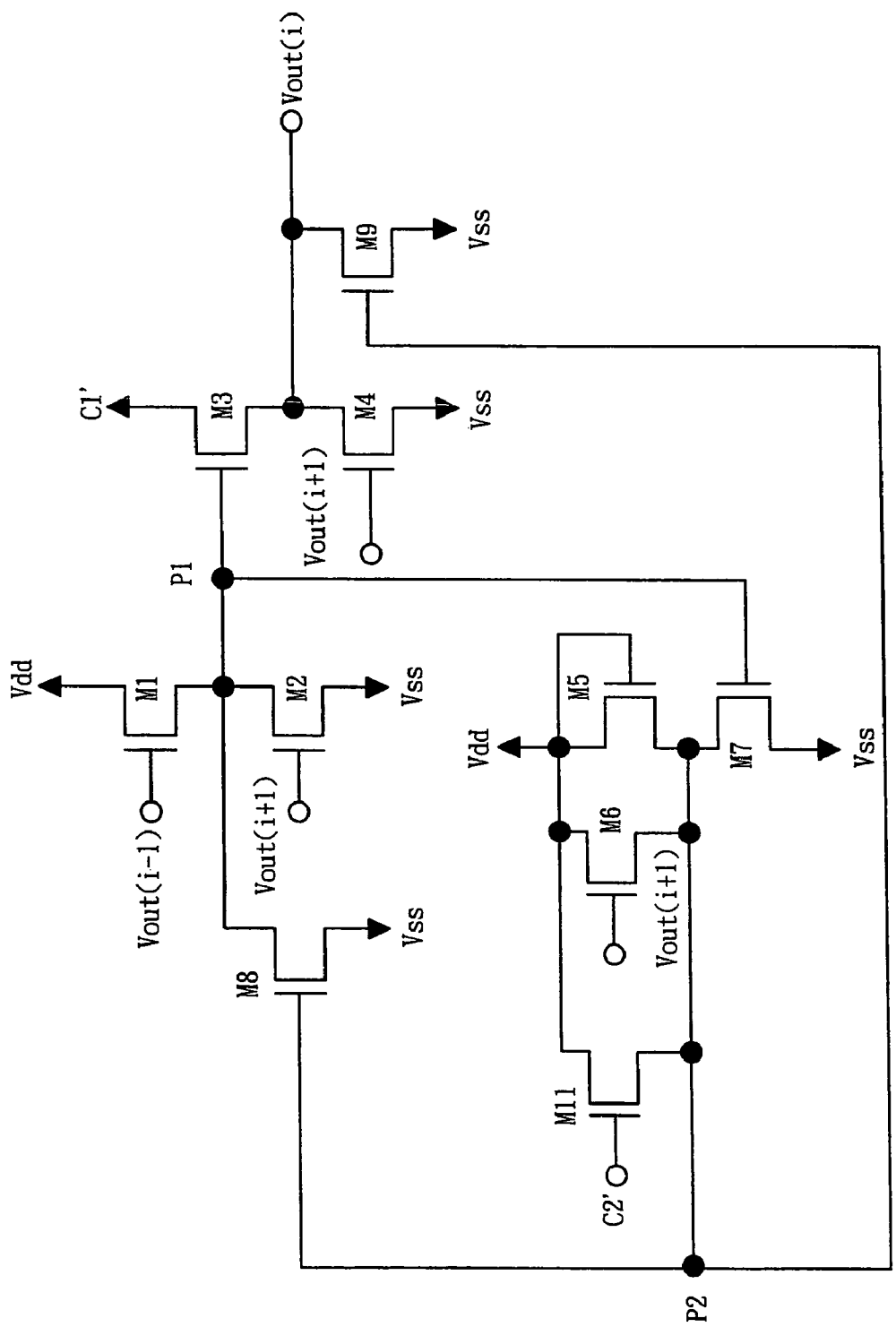
FIG. 15 is a schematic circuit for the 7th embodiment of the current invention.

Please refer to FIG. 15, which is the schematic circuit for the 7th embodiment of the current invention. As shown in the figure, the difference between this example and the 6th embodiment is that clock pulse signals C1 and C2 in this circuit are replaced by C1' and C2'. The timing diagram is shown in FIG. 13. The logic high voltage level $V_H$ for C1' and C2' equals the high-level supply voltage Vdd while the logic low voltage level $V_L$ for C1' and C2' is slightly lower than the low-level supply voltage Vss.

Similar to the 5th embodiment, the logic low voltage level $V_L$ of the second clock pulse signal C2' is slightly lower than the low-level supply voltage Vss, which results in the eleventh transistor M11 being at a negative stress then it is turned off so as to recover the Vth of the eleventh transistor M11 and to extend the lifetime of the eleventh transistor M11.

Figure 16:
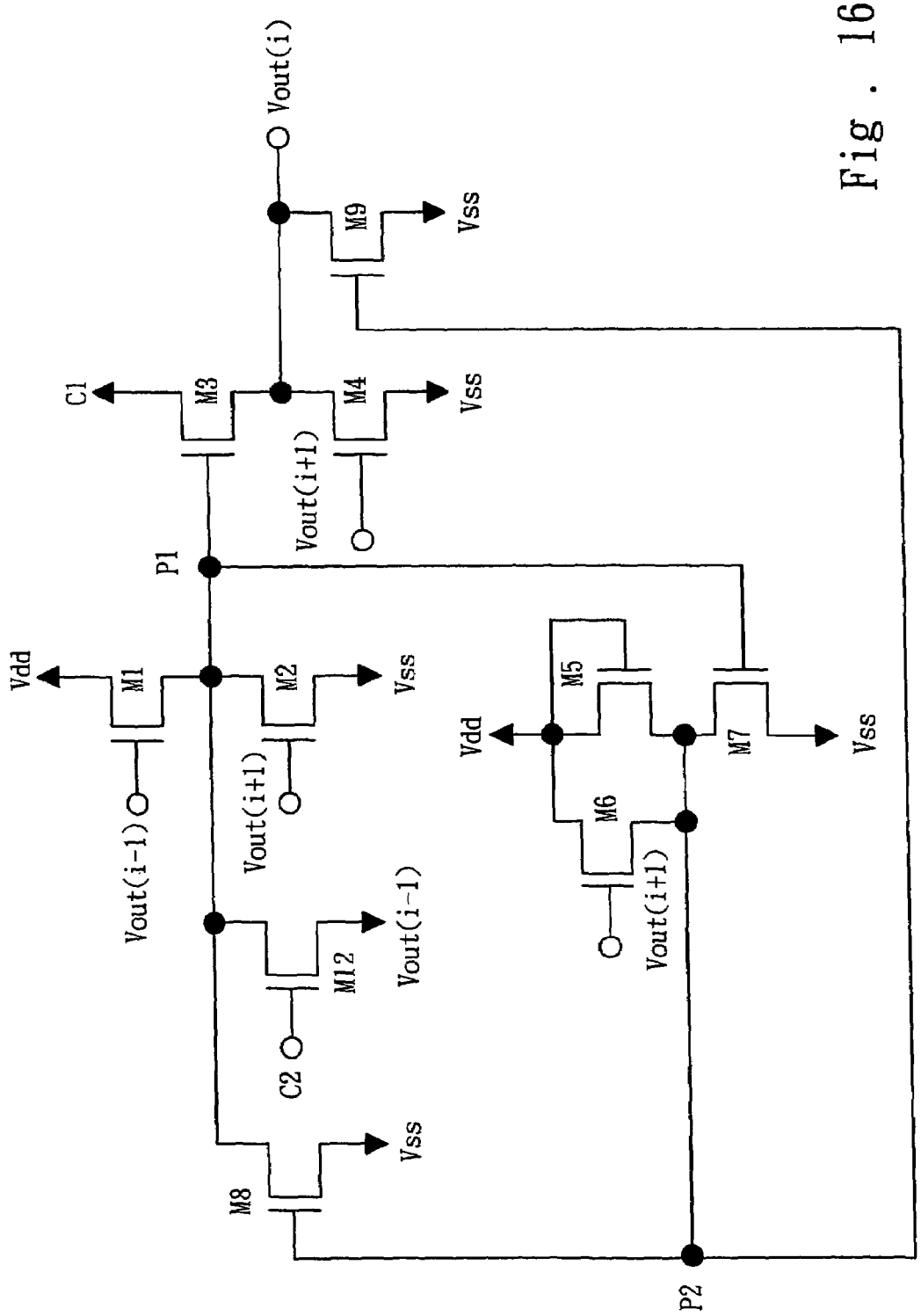
FIG. 16 is a schematic circuit for the 8th embodiment of the current invention.

Please refer to FIGS. 10 and 16, which are the block diagram of another shift register of the current invention and the schematic circuit for the 8th embodiment. As shown in figures, the difference between this example and the 1st embodiment is that the twelfth one transistor M12 is added to the first node P1, whose gate connects to the second clock pulse signal C2 and the source connects to the output voltage of the next-former stage Vout(i−1). Transistor M12 is parallel to the eighth transistor M8 so as to assist the eighth transistor M8 in promoting the supplement ability. The timing diagram is shown in FIG. 7. The eighth transistor M8 turns on continuously will avoid the first node P1 being shortly floated. The twelfth transistor M12 is controlled by the second clock pulse signal C2, which not only promotes the ability to supplement the eighth transistor M8 but also extends the circuit lifetime.

However, the drain of the third transistor M3 of the even stages connects to the second clock pulse signal C2, and the gate of the twelfth transistor M12 connects to the first clock pulse signal C1.

Figure 17:
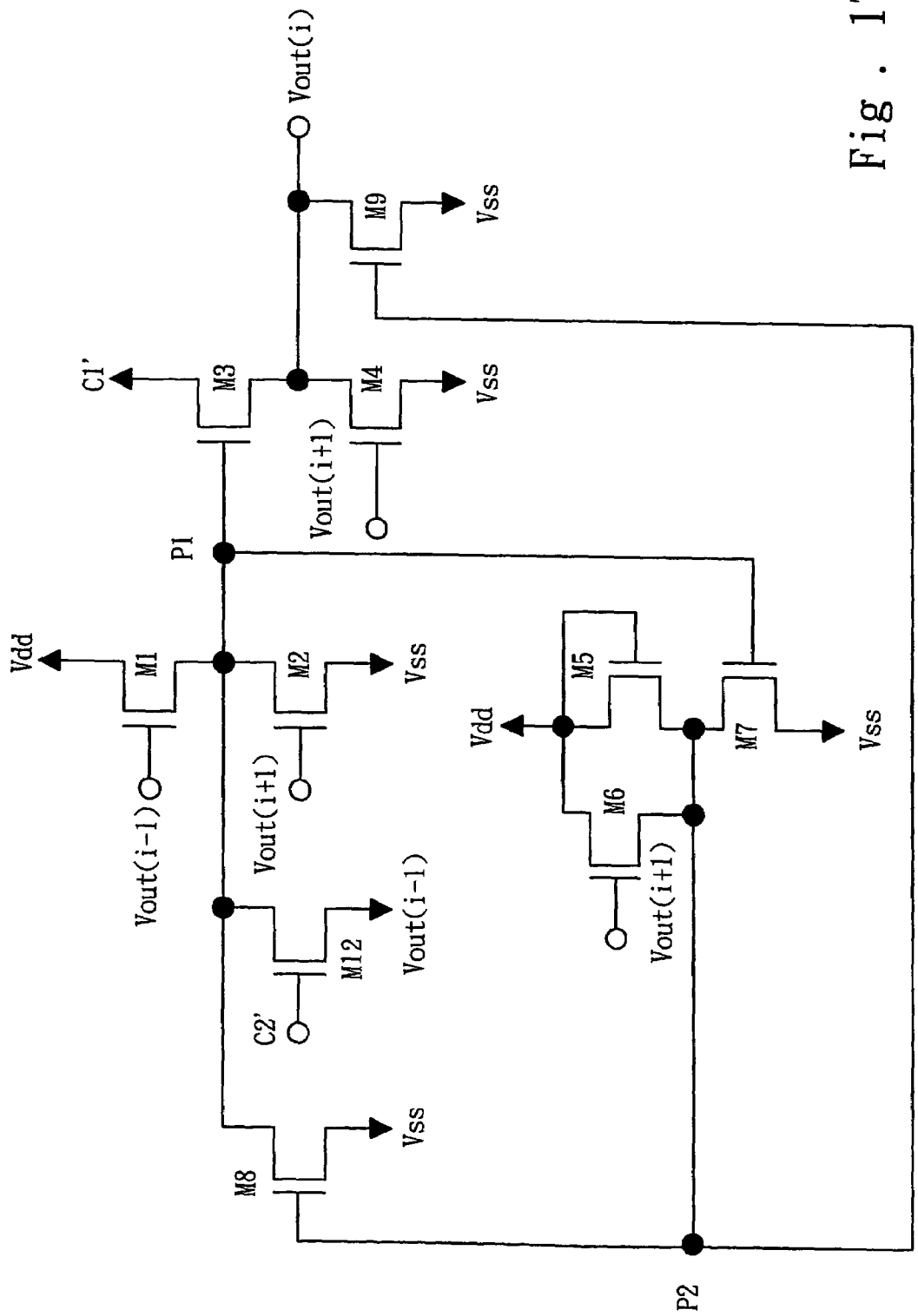
FIG. 17 is a schematic circuit for the 9th embodiment of the current invention.

Please refer to FIG. 17, which is the schematic circuit for the 9th embodiment of the current invention. As shown in the figure, the difference between this example and the 8th embodiment is that clock pulse signals C1 and C2 in this circuit are replaced by C1' and C2'. The timing diagram is shown in FIG. 13. The logic high voltage level $V_H$ for C1' and C2' equals the high-level supply voltage Vdd while the logic low voltage level $V_L$ for C1' and C2' is slightly lower than the low-level supply voltage Vss.

Similar to the aforementioned 5th embodiment, the logic low voltage level $V_L$ of the second clock pulse signal C2' is slightly lower than the low-level supply voltage Vss, which results in the twelfth transistor M12 being at a negative stress when it is turned off so as to recover the Vth of the twelfth transistor M12 and to extend the lifetime of the twelfth transistor M12.

While the preferred embodiments of the invention has been set forth for the purpose of disclosure, modifications of the disclosed embodiments of the invention as well as other embodiments thereof may occur to those skilled in the art.

Accordingly, the appended claims are intended to cover all embodiments which do not depart from the spirit and scope of the invention.

What is claimed is:

1. A high-reliability shift register circuit which is composed of several stages, wherein the stages are connected in serial and send output signals to gate lines of a panel, comprising:
   a serial-in signal is fed into a first stage, and input signals for every additional stage are from an output signal of a first previous stage respectively, wherein the shift register circuit is controlled by first and second clock-pulse signals, which are out of phase;
   each odd stage of the stages comprises:
   a first transistor whose gate connects to the output signal of the first previous stage and whose drain connects to a high-level supply voltage;
   a second transistor whose gate connects to an output signal of the first subsequent stage or to an output signal of a second subsequent stage whose source connects to a low-level supply voltage, and whose drain and the source of the first transistor form a first node;
   a third transistor whose gate connects to the first node and whose drain connects to the first clock-pulse signal;
   a fourth transistor whose gate connects to the output signal of the first subsequent stage or to the output signal of the second subsequent stage, whose source connects to the low-level supply voltage, and whose drain and the source of the third transistor form the output terminal of each odd stage;
   a fifth transistor whose gate and drain connect to the high-level supply voltage;
   a sixth transistor whose gate connects to the output signal of the first subsequent stage or to the output signal of the second subsequent stage, whose drain connects to the high-level supply voltage, and whose source and a source of the fifth transistor form a second node;
   a seventh transistor whose gate connects to the first node, whose source connects to the low-level supply voltage, and whose drain connects to the source of the fifth transistor, where the fifth transistor and the seventh transistor form an inverter;
   an eighth transistor whose gate connects to the second node, whose source connects to the low-level supply voltage, and whose drain connects to the first node;
   a ninth transistor whose gate connects to the second node, whose source connects to the low-level supply voltage, and whose drain connects to the output terminal of each odd stage.

2. The high-reliability shift register circuit as claimed in claim 1, wherein the seventh transistor is larger than the fifth transistor.

3. The high-reliability shift register circuit as claimed in claim 1, wherein all the transistors are amorphous silicon Thin Film Transistors (a-Si TFT).

4. The high-reliability shift register circuit as claimed in claim 1, wherein all the transistors are Low Temperature Poly-Silicon Thin Film Transistors (LTPS TFT).

5. The high-reliability shift register circuit as claimed in claim 1, wherein the gate of the sixth transistor is connected to the output signal of the first subsequent stage when the gate of the fourth transistor is connected to the output signal of the first subsequent stage, and the gate of the sixth transistor is connected to the output signal of the second subsequent stage when the gate of the fourth transistor is connected to the output signal of the second subsequent stage.

6. The high-reliability shift register circuit as claimed in claim 1, further comprising a tenth transistor connected to the output terminal of the odd stages of the shift register, wherein the tenth transistor includes a gate connected to the second clock pulse signal, a source connected to the low-level supply voltage, and a drain connected to the output terminal of each odd stage.

7. The high-reliability shift register circuit as claimed in claim 6, wherein the logic high voltage level for clock pulse signals equals the high-level supply voltage while the logic low voltage level for clock pulse signals is slightly lower than the low-level supply voltage.

8. The high-reliability shift register circuit as claimed in claim 1, further comprising an eleventh transistor parallel to the fifth transistor and the sixth transistor, wherein a gate of the eleventh transistor is connected to the second clock-pulse signal.

9. The high-reliability shift register circuit as claimed in claim 8, wherein the logic high voltage level for clock pulse signals equals the high-level supply voltage while the logic low voltage level for pulse signals is slightly lower than the low-level supply voltage.

10. The high-reliability shift register circuit as claimed in claim 1, further comprising a twelfth transistor connected to the first node, wherein a gate of the twelfth transistor is connected to the second clock pulse signal and a source of the twelfth transistor is connected to the output voltage of the first previous stage.

11. The high-reliability shift register circuit as claimed in claim 10, wherein the logic high voltage level for clock pulse signals equals the high-level supply voltage while the logic low voltage level is slightly lower than the low-level supply voltage.

12. The high-reliability shift register circuit as claimed in claim 1, wherein each even stage of the stages comprises:
   a first even-stage transistor whose gate connects to the output signal of the first previous stage and whose drain connects to the high-level supply voltage;
   a second even-stage transistor whose gate connects to an output signal of the first subsequent stage or to an output signal of the second subsequent stage whose source connects to the low-level supply voltage, and whose drain and the source of the first even-stage transistor form the first node;
   a third even-stage transistor whose gate connects to the first node and whose drain connects to the second clock-pulse signal;
   a fourth even-stage transistor whose gate connects to the output signal of the first subsequent stage or to the output signal of the second subsequent stage, whose source connects to the low-level supply voltage, and whose drain and the source of the third even-stage transistor form the output terminal of each even stage;
   a fifth even-stage transistor whose gate and drain connect to the high-level supply voltage;
   a sixth even-stage transistor whose gate connects to the output signal of the first subsequent stage or to the output signal of the second subsequent stage, whose drain connects to the high-level supply voltage, and whose source and a source of the fifth even-stage transistor form the second node;
   a seventh even-stage transistor whose gate connects to the first node, whose source connects to the low-level supply voltage, and whose drain connects to the source of the fifth even-stage transistor, where the fifth even-stage transistor and the seventh even-stage transistor form an inverter;

an eighth even-stage transistor whose gate connects to the second node, whose source connects to the low-level supply voltage, and whose drain connects to the first node;

a ninth even-stage transistor whose gate connects to the second node, whose source connects to the low-level supply voltage, and whose drain connects to the output terminal of each even stage.

13. The high-reliability shift register circuit as claimed in claim 12, wherein the gate of the sixth even-stage transistor is connected to the output signal of the first subsequent stage when the gate of the fourth even-stage transistor is connected to the output signal of the first subsequent stage, and the gate of the sixth even-stage transistor is connected to the output signal of the second subsequent stage when the gate of the fourth even-stage transistor is connected to the output signal of the second subsequent stage.

14. The high-reliability shift register circuit as claimed in claim 12, further comprising a tenth even-stage transistor connected to the output terminal of the even stages of the shift register, wherein the tenth even-stage transistor includes a gate connected to the first clock pulse signal, a source connected to the low-level supply voltage, and a drain connected to the output terminal of each even stage.

15. The high-reliability shift register circuit as claimed in claim 12, further comprising an eleventh even-stage transistor parallel to the fifth even-stage transistor and the sixth even-stage transistor, wherein a gate of the eleventh even-stage transistor is connected to the first clock-pulse signal.

16. The high-reliability shift register circuit as claimed in claim 12, further comprising a twelfth even-stage transistor connected to the first node, wherein a gate of the twelfth even-stage transistor is connected to the first clock pulse signal and a source of the twelfth even-stage transistor is connected to the output voltage of the first previous stage.

* * * * *